United States Patent [19]
Tedrow et al.

[11] Patent Number: 5,497,119
[45] Date of Patent: Mar. 5, 1996

[54] HIGH PRECISION VOLTAGE REGULATION CIRCUIT FOR PROGRAMMING MULTILEVEL FLASH MEMORY

[75] Inventors: Kerry D. Tedrow, Orangevale; Stephen N. Keeney, Sunnyvale; Albert Fazio, Los Gatos; Gregory E. Atwood, San Jose; Johnny Javanifard, Sacramento; Kenneth Woiciechowski, Folsom, all of Calif.

[73] Assignee: Intel Corporation, Santa Clara, Calif.

[21] Appl. No.: 252,585

[22] Filed: Jun. 1, 1994

[51] Int. Cl.$^6$ ............................... G05F 1/10; H03K 3/02
[52] U.S. Cl. .................... 327/540; 327/344; 327/336; 327/392; 327/394; 327/538; 327/539; 327/541; 323/265; 323/282; 323/288; 323/313
[58] Field of Search .................... 365/226, 149, 365/189.06; 323/313, 265, 282, 288; 307/296.1, 296.1; 327/540, 344, 336, 392, 394, 538, 539, 541

[56] References Cited

U.S. PATENT DOCUMENTS

| | | | |
|---|---|---|---|
| 4,928,056 | 5/1990 | Pease | 323/314 |
| 5,159,260 | 10/1992 | Yoh et al. | 323/313 |
| 5,175,451 | 12/1992 | Ihara | 307/530 |
| 5,229,662 | 7/1993 | Truong et al. | 307/455 |
| 5,281,866 | 1/1994 | Rundel | 307/296.3 |
| 5,311,072 | 5/1994 | Matsui et al. | 307/353 |
| 5,362,991 | 11/1994 | Samela | 327/540 |
| 5,382,841 | 1/1995 | Feldbaumer | 326/30 |

*Primary Examiner*—Viet Q. Nguyen
*Attorney, Agent, or Firm*—Blakely, Sokoloff, Taylor & Zafman

[57] ABSTRACT

A voltage regulation circuit that includes a sample and hold circuit for sampling an input voltage and for holding a reference voltage generated in response to the input voltage. The sample and hold circuit includes a capacitor that holds the reference voltage. The voltage regulation circuit also includes a regulator circuit coupled to the capacitor of the sample and hold circuit. The regulator circuit outputs an output voltage using the reference voltage supplied by the capacitor. The voltage regulation circuit may be used to provide a high precision programming voltage for programming memory cells having two or more analog states.

28 Claims, 8 Drawing Sheets

HIGH PRECISION VOLTAGE REGULATION CIRCUIT FOR PROGRAMMING MULTILEVEL FLASH MEMORY

FIELD OF THE INVENTION

The present invention relates generally to voltage regulation and more particularly to the high accuracy voltage regulation for programming a memory cell that stores multiple bits of data.

BACKGROUND

Nonvolatile semiconductor memories use a variety of semiconductor memory cell designs. One type of memory cell uses an electrically isolated floating gate to trap charge. A variety of mechanisms can be used to insert charge into the floating gate and to pull charge from it. Electron tunneling can be used both to inject charge and to pull charge off the floating gate of a memory cell. Hot electron injection is another mechanism for inserting charge into a floating gate of a memory cell. Other nonvolatile semiconductor memories use a trapping dielectric to insert or remove charge from between the control gate of a memory cell and silicon.

For a memory cell that includes a floating gate, data is stored in the memory cell by altering the amount of charge on the floating gate, which causes the threshold voltage $V_t$ of the memory cell to be varied. A typical prior art memory cell is capable of achieving one of two possible analog states, being either "programmed" or "erased". The analog states of a memory cell may be expressed as ranges of threshold voltages $V_t$, cell currents $I_d$, or charge levels stored on the floating gate. Theoretically, the flash cell can possess a separate identifiable state for each electron that is added to the floating gate. Practically speaking, the maximum possible number of states for a memory cell is limited because of inconsistencies in memory cell structure, charge loss over time, thermal considerations and inaccuracies in sensing the charge on the floating gate that affect the ability to determine the data stored in the memory cell. It is possible, however, for the floating gate to achieve more than two analog states. This permits storage of multiple bits of data in a single memory cell, which is sometimes called multistate or multilevel storage.

Increasing the number of bits that are stored in a single memory cell has several consequences with respect to programming the memory cell. First, the storage of multiple bits in a memory cell typically requires a narrow range of $V_t$ voltages for each state. "Programming overshoot" thus becomes a concern, and care must be taken to precisely place the memory cell into the desired analog state. Programming overshoot occurs when the memory cell is programmed beyond the desired state. Programming overshoot is typically not a concern for prior single bit flash cells because the single bit flash cell can achieve no state beyond the programmed state.

Second, the narrow ranges of threshold voltages $V_t$ for each state and the need for accurate placement of states result in the values of the programming voltage levels being a critical parameter for accurately programming the memory cell. Typically, an external power supply is used to determine the programming voltage levels. The inaccuracy inherent in most power supplies therefore becomes troublesome. For example, the programming voltage $V_G$ that is applied to the select gate of a memory cell during programming has a one-to-one correspondence to the final threshold voltage $V_t$ of the memory cell. Any fluctuations in the programming voltage $V_G$ during a programming cycle results in corresponding fluctuations of the threshold voltage $V_t$, and programming overshoot can occur.

One method to provide accurate programming voltage levels is to use a very high precision power supply, e.g. a power supply having a 1% setpoint accuracy level. Such power supplies are cost-prohibitive, however, and another solution would be preferable.

SUMMARY AND OBJECTS OF THE INVENTION

An object of the present invention is to provide stable voltage reference circuitry for use by a voltage regulation circuit.

Another object of the invention is to provide regulated programming voltages for the programming of a memory cell.

Another object of the invention is to provide voltage regulation circuitry that supplies a high precision output voltage that is independent of variations of an external input power supply, wherein such high precision output voltages are useful for programming multilevel memory cells.

These and other objects of the invention are provided for by a voltage regulation circuit that includes a sample and hold circuit for sampling an input voltage and for holding a reference voltage generated in response to the input voltage. The sample and hold circuit includes a capacitor that holds the reference voltage. The voltage regulation circuit also includes a regulator circuit coupled to the capacitor of the sample and hold circuit. The regulator circuit outputs an output voltage using the reference voltage supplied by the capacitor.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
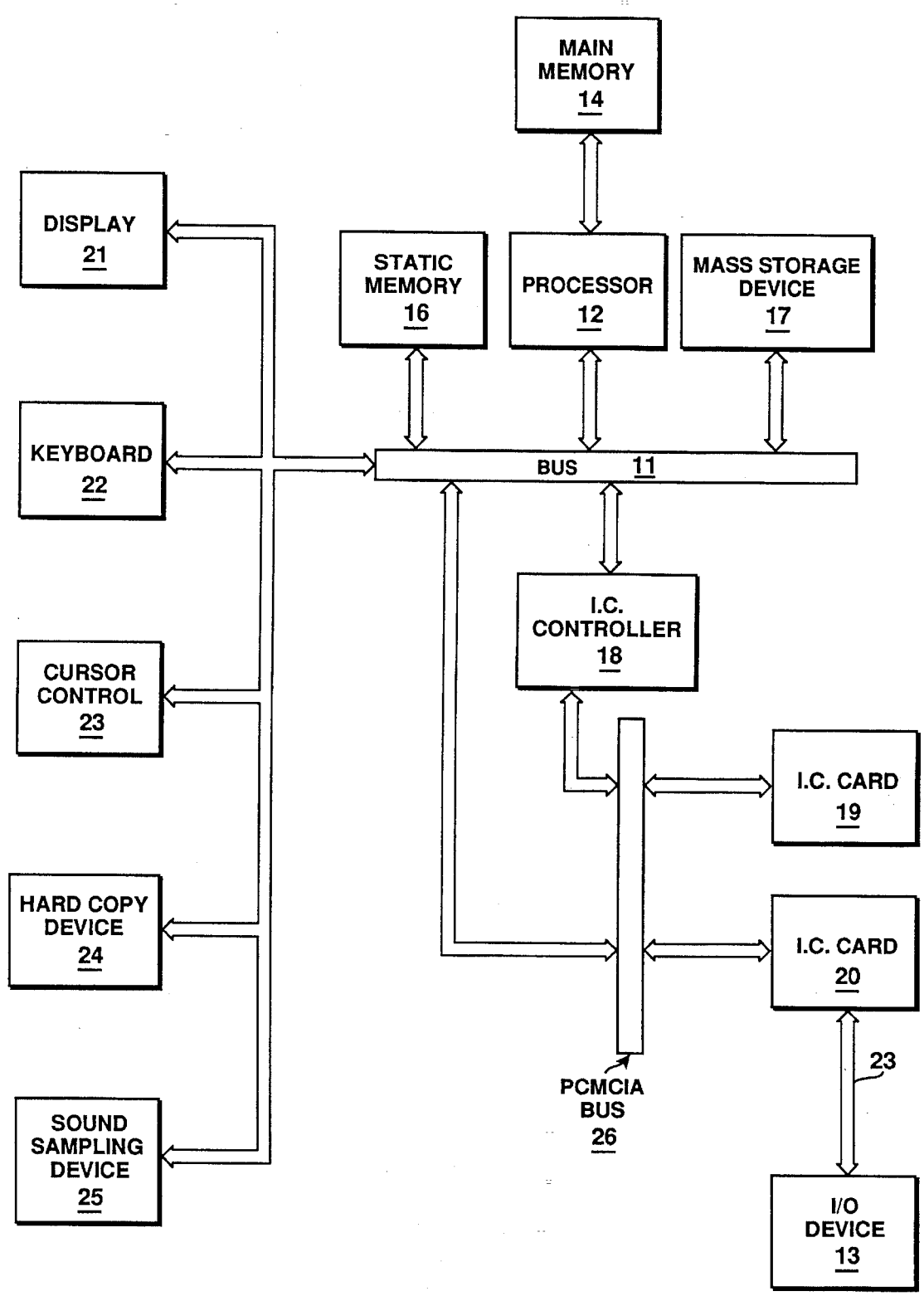
FIG. 1 shows a computer system according to one embodiment.

FIG. 1 shows a computer system of one embodiment. The computer system generally includes a bus 11, to which may be coupled a processor 12, main memory 14, static memory 16, mass storage device 17, and integrated circuit controller 18. Static memory 16 may include a flash electrically eraseable programmable read only memory ("flash EEPROM") or other nonvolatile memory device that stores multiple bits of data per cell. Similarly, mass storage device 17 may be a solid state hard drive 17 using multiple bit per cell nonvolatile memory devices for storing data. The solid state hard drive 17 emulates standard IDE hardware and BIOS-equipped systems and uses an industry standard AT-Attachment Interface for Disk Drives (ATA) command such that no software drivers are required. In this manner, the solid state hard drive 17 appears as a magnetic hard disk drive to the computer system, but the solid state disk drive 17 has reduced thickness and weight compared to typical magnetic hard disk drives which makes the solid state disk drive especially useful for mobile computers.

Integrated circuit cards 19 and 20 may be included in the computer system and are coupled to a Personal Computer Memory Card Industry (PCMCIA) bus 26. PCMCIA bus 26 is coupled to bus 11 and to integrated circuit (IC) controller 18 for providing communication information between cards 19 and 20 and the remainder of the computer system. IC controller 18 provides control and address information to IC cards 19 and 20 via PCMCIA bus 26 and is coupled to bus 11. The IC cards 19 and 20 may be memory cards that include multiple bit per cell nonvolatile memory devices for storing data.

The computer system may further include a display device 21, a keyboard 22, a cursor control device 23, a hard copy device, and a sound sampling device 25. The specific configuration of the computer system is determined by the particular applications for which the computer system is to be used. For example, the computer system of FIG. 1 may be a personal digital assistant (PDA), a pen-based computer system, a mainframe computer, or a personal computer.

Figure 2:
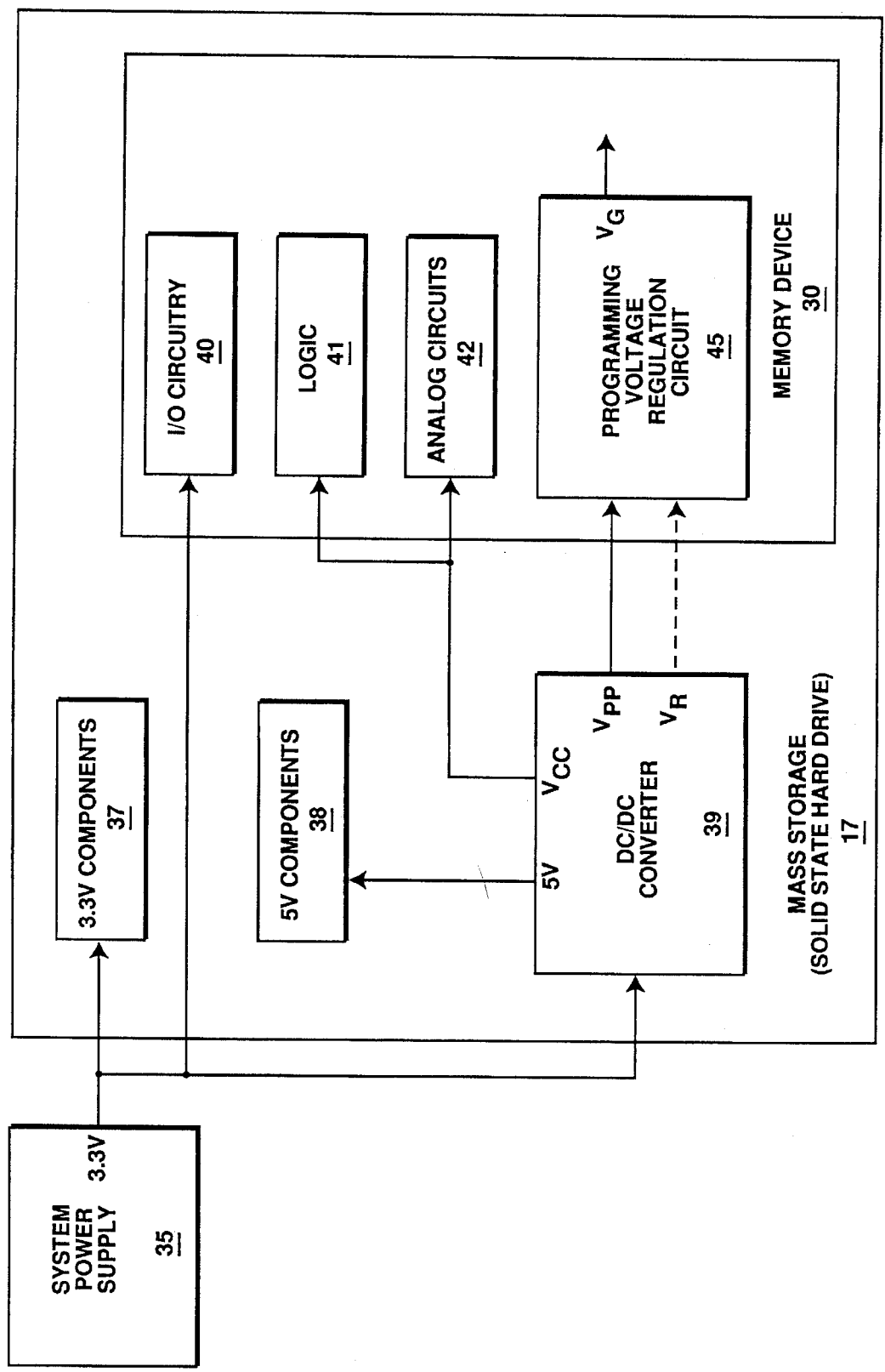
FIG. 2 shows a solid state hard drive according to one embodiment.

FIG. 2 shows the mass storage device in greater detail. Mass storage device 17 is shown as a solid state hard drive that includes a nonvolatile memory device 30 for storing information. The memory device 30 includes an array of memory cells (not shown), wherein each memory cell is capable of being in two or more analog states. A system power supply 35 provides regulated operating voltages to the solid state hard drive 17. The system power supply 35 is shown as having a 3.3 volt output at ±10% accuracy. In addition to the memory device 30, the solid state hard drive 17 includes 3.3 volt components 37, which receive their operating voltage from the system power supply 35, and 5.0 volt components 38 which may also receive their operating voltage from the system power supply 35. As shown, however, the 5.0 volt components 38 receive their operating voltage from a DC-to-DC converter 39, which is coupled to the system power supply 35 for outputting various voltages to the memory device 30.

The supply pins of the DC-to-DC converter 39 include a VCC pin, a VPP pin, a $V_R$ pin, and a 5 v pin. Each of the supply pins is internally connected to circuitry of the DC-to-DC converter 39 that is isolated from the circuitry of every other supply pin. In this manner, the supply pins are decoupled from one another, and the noise resulting from activity at the load of another supply pin is reduced. Thus, the DC-to-DC converter 39 may be equivalently provided as four separate DC-to-DC converters, each having one supply pin.

With the exception of the I/O circuitry, which operates at 3.3 volts, the memory device 30 has an operating voltage VCC of 5.25 volts at ±2%. The operating voltage VCC is used by the memory device 30 for all read operations, and may be used by the 5.0 volt components 38. Preferably, however, the VCC supply pin of the DC-to-DC converter 39 provides power only to the memory device 30 such that the noise and load of the DC-to-DC converter 39 is reduced. The output of the 5 v supply pin is 5.0 volts.

The DC-to-DC converter also supplies a programming voltage VPP of 12.0 volts at ±2% to a programming voltage regulation circuit 45 of the memory device 30. Alternatively, as shown by dashed lines, the DC-to-DC converter may output a stable reference voltage $V_R$ of 11.0 volts at 0.5–1% accuracy. The stable reference voltage $V_R$ supply pin is a low power supply pin that is able to supply a limited amount of current. As described below, the programming voltage regulation circuit 45 receives an input voltage and provides an output voltage that is independent of the input voltage supply. The input voltage may be either VPP or $V_R$, and the output voltage may be used as a programming voltage for programming a nonvolatile memory cell. The precision provided by the programming voltage regulation circuit 45 is especially useful when programming a memory cell that is capable of achieving 3 or more states, i.e. a memory cell that stores more than one bit of data. IC cards 19 and 20 may have an architecture similar to that of the solid state hard drive 17.

Figure 3:
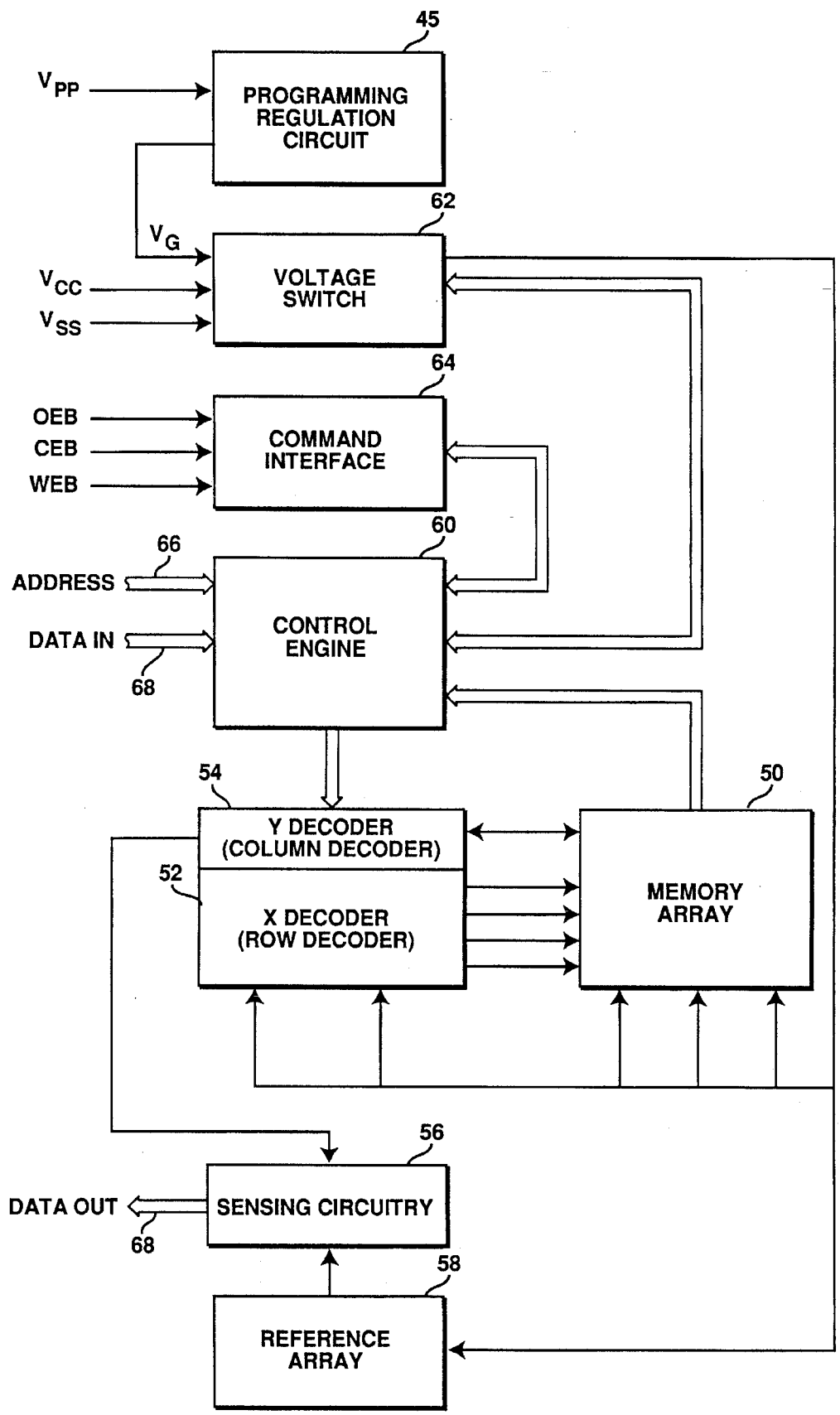
FIG. 3 shows a nonvolatile memory device including a programming voltage regulation circuit.

FIG. 3 shows the memory device in greater detail. Memory device 30, which is fabricated on a single semiconductor substrate, includes memory array 50, X decoder 52, Y decoder 54, sensing circuitry 56, reference array 58, control engine 60, voltage switch 62, command interface 64 and programming regulation circuit 45, which operates as described below.

Users provide addresses to the memory device 30 via address lines 66 and receive data from the memory device 30 via data lines 68. Memory device 30 stores data using nonvolatile memory cells within memory array 50. The threshold voltages of the nonvolatile memory cells can be altered during programming, thus permitting storage of analog voltage levels. Memory array 50 may include any type of memory cell with programmable threshold voltages, such as memory cells with trapping dielectrics or floating gates. In one embodiment, memory array 50 is comprised of flash memory cells that each are capable of achieving two or more analog states.

To read data stored in the memory array 50, X decoder 52 and Y decoder 54 select a number of memory cells of the memory array 50 in response to a user-provided address received via address lines 66. X decoder 52 selects the appropriate row within memory array 50. For this reason, X decoder 52 is also called row decoder 52. Similarly, Y decoder 54 selects the appropriate column within memory array 50. Because of its function, Y decoder 54 is also called column decoder 54.

Data output from memory array 50 is coupled to Y decoder 54, which passes the data on to sensing circuitry 56. Sensing circuitry 56 compares the states of the selected memory cells to the states of reference cells of reference cell array 58. Sensing circuitry 56 includes differential comparators that output digital logic voltage levels in response to the comparisons between memory cells and reference cells. In this manner, the analog states of the memory cells are expressed and output as digital data.

For an embodiment of memory device 30, control engine 60 controls the erasure and programming of memory array 50. Control engine 60 also controls the programming of multilevel cells. For one embodiment, control engine 60 includes a processor that is controlled by microcode stored in on-chip memory. The particular implementation of control engine 60 does not affect the present high precision voltage regulation circuitry.

Control engine 60 manages memory array 50 via control of row decoder 152, column decoder 154, sensing circuitry 156, reference cell array 158, voltage switch 62, and programming voltage regulation circuit 45. Voltage switch 62 controls the various voltage levels necessary to read, and erase memory array 150, and also supplies a drain voltage VDD for programming. The programming voltage regulation circuit 45 provides the select gate voltages for programming.

User commands for reading, erasure, and programming are communicated to control engine 60 via command interface 64. The external user issues commands to command interface 64 via three control pins: output enable OEB, write enable WEB, and chip enable CEB.

Figure 4:
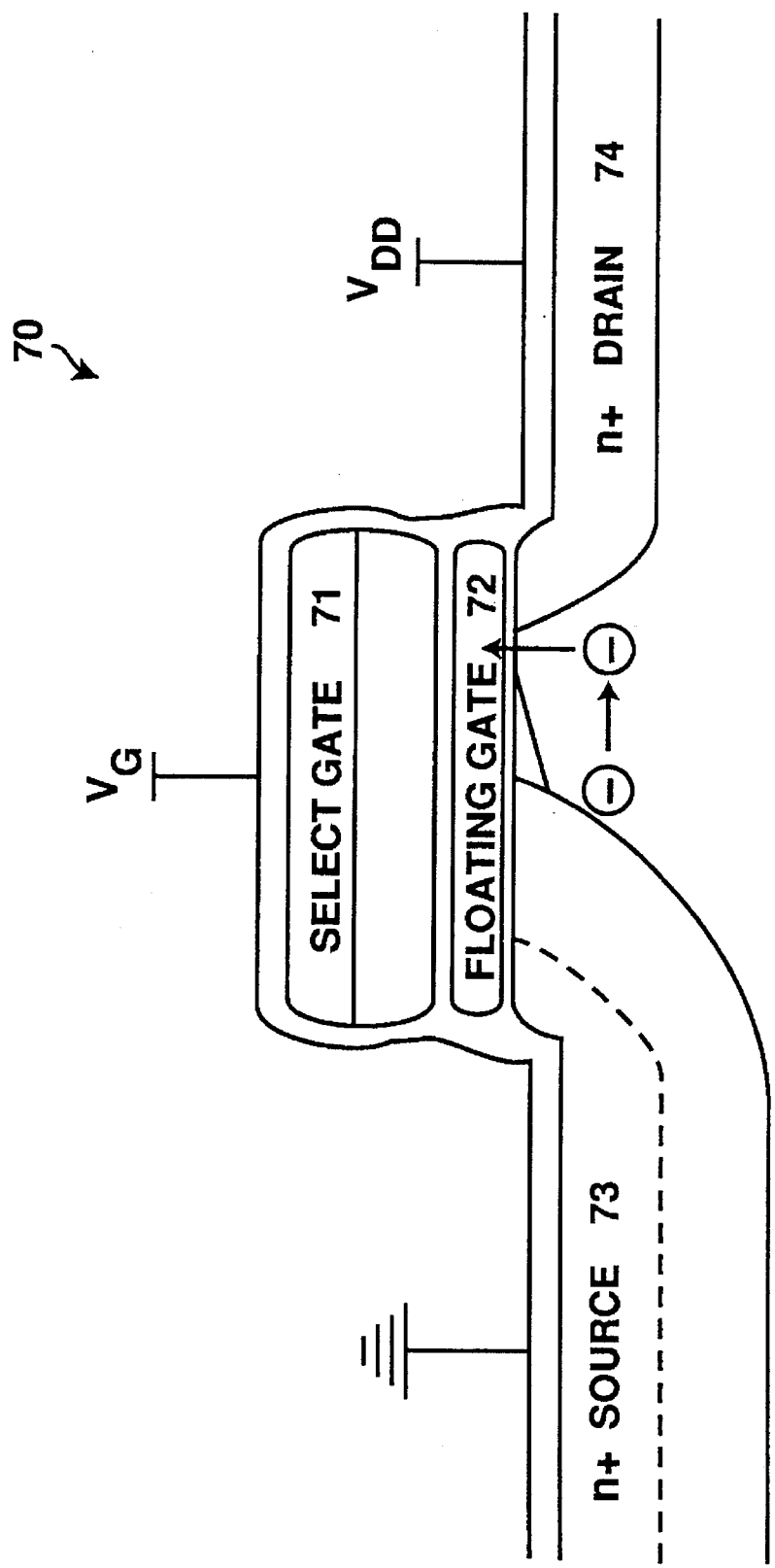
FIG. 4 shows a flash memory cell configured for programming.

FIG. 4 shows a flash memory cell configured for programming. The flash memory cell 70 includes select gate 71, which is connected to a programming voltage $V_G$. A typical programming voltage $V_G$ for prior flash memory cells is 12.0 volts supplied by a programming supply VPP. The flash memory cell 70 also includes floating gate 72, a source 73, and a drain 74, wherein the source 73 and the drain 74 are formed in substrate 75. The memory cell essentially acts as a field effect transistor ("FET") having a threshold voltage $V_t$ that is variable according to the amount of charge stored on the floating gate 72. The primary mechanism for placing charge on the floating gate 72 is hot electron injection. The flash memory cell 70 is capable of achieving two or more analog states.

Applying the programming voltage $V_G$ to the select gate 71 switches the FET of the flash memory cell on, causing current to flow from the drain 74 to the source 73. The programming voltage $V_G$ also creates a "vertical" electric field between the substrate 75 and the floating gate 72. Electron flow in the vertical electric field is depicted as an arrow having its head at floating gate 72 and its tail at substrate 75. This substantially shows the direction of electron flow in the vertical electric field. As shown, the source 73 is coupled to system ground VSS, and the drain 74 is coupled to a drain voltage VDD. The difference in potential between the drain 74 and the source 73 creates a "horizontal" electric field that accelerates electrons from the source 73 across the channel towards the drain 74. For one embodiment, it is sufficient for VDD to be 5–7 volts greater than the voltage at source 73. Electron flow in the horizontal electric field is shown as an arrow having its head at drain 74 and its tail at source 73. This substantially shows the direction of electron flow across the channel. The accelerated or "hot" electrons collide with the lattice structure of the substrate 75, and some of the hot electrons are swept onto the floating gate by the vertical electric field. In this manner, the amount of charge stored on the floating gate may be increased.

The control engine 60 controls the application of voltages to the flash memory cell using one or more "programming pulses" to program the flash memory cell. A programming pulse is a fixed length of time during which the programming voltage $V_G$ and the drain voltage VDD are applied. A "programming cycle" is a maximum time allowed by a particular programming algorithm to program a flash memory cell. Several programming pulses are typically included in a single programming cycle.

Figure 5:
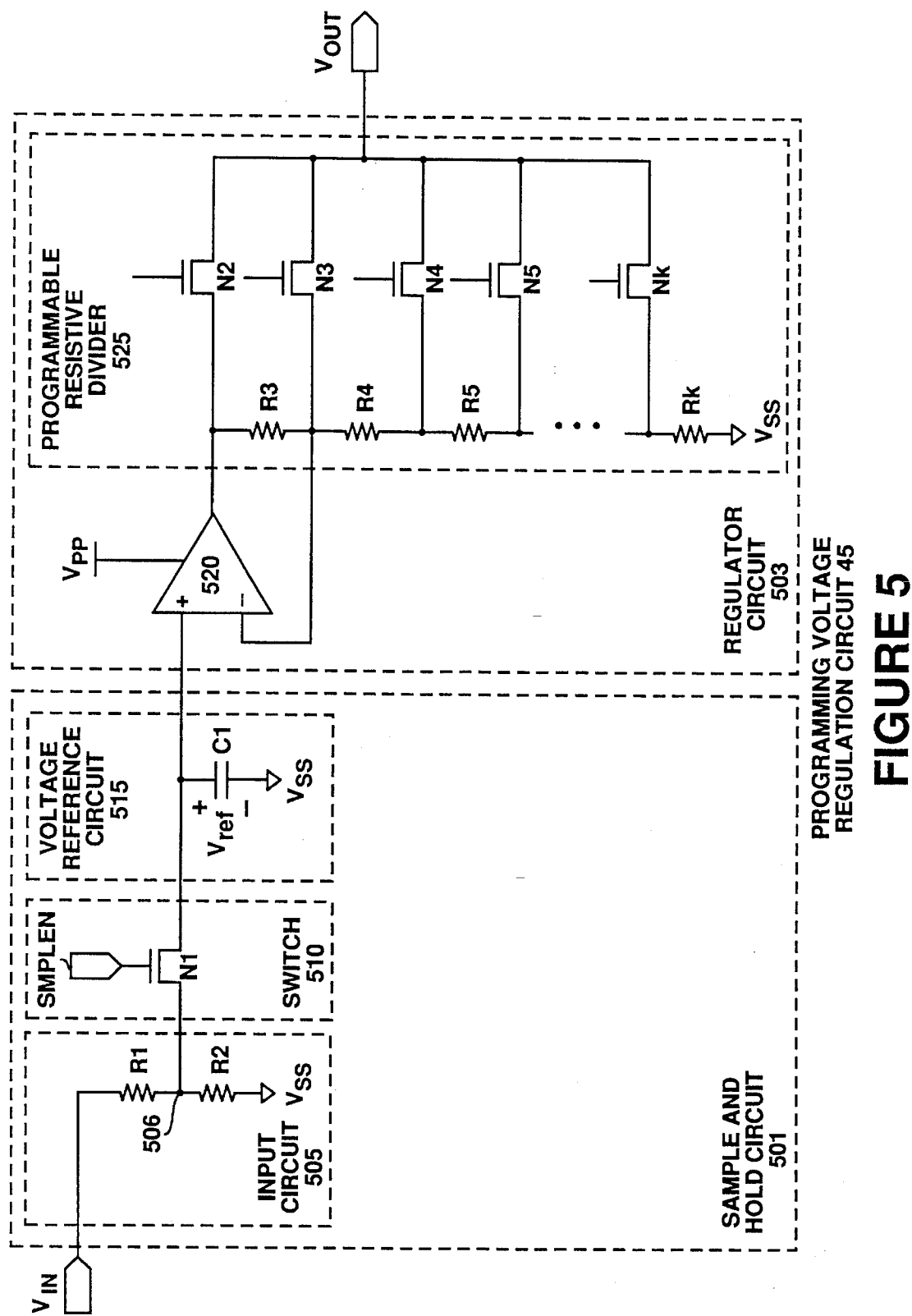
FIG. 5 shows a programming voltage regulation circuit according to one embodiment.

FIG. 5 shows a programming voltage regulation circuit according to one embodiment. The programming voltage regulation circuit may be used to provide a programming voltage $V_G$ to the select gate of a memory cell during programming. The programming voltage regulation circuit may also be used to supply a source voltage and the drain voltage VDD during the programming of the memory cell. The precision provided by the programming voltage regulation circuit is especially useful wherein the memory cell is capable of achieving three or more analog states.

The programming voltage regulation circuit 45 includes a sample and hold circuit 501 that samples an input voltage $V_{in}$ to generate a reference voltage $V_{ref}$, which the sample and hold circuit 501 holds for the duration of one full programming cycle. The regulator circuit 503 uses the reference voltage $V_{ref}$ to supply desired output voltages $V_{out}$. According to one embodiment, the control engine determines when the sample and hold circuit 501 samples the input voltage $V_{in}$ and programs the regulator circuit 503 to output the necessary output voltages for each programming pulse of the programming cycle. The input voltage $V_{in}$ is the programming voltage VPP, and the output voltage $V_{out}$ is the gate voltage applied to the gates of memory cells for programming. Alternatively, the input voltage $V_{in}$ may be the stable reference voltage $V_R$.

The sample and hold circuit 501 includes an input circuit 505 coupled to the input voltage $V_{vin}$, a switch 510 coupled to the input circuit 505, and a voltage reference circuit 515 coupled to the switch 510. The input circuit 505 is shown as resistors R1 and R2 which are connected in series between the input voltage Vin and system ground VSS. The switch 510 is shown as n-channel field effect transistor ("FET") N1 having its drain coupled to the input circuit 505 at node 506. Thus, the resistors R1 and R2 are configured as a voltage divider for supplying the reference voltage $V_{ref}$ to the voltage reference circuit 515 when the switch 510 is closed. For this embodiment, resistors R1 and R2 are preferably of equal value such that the reference voltage level Vref is equal to one half of VPP.

The FET N1 is switched on and off in response to a sample enable signal SMPLEN, which is supplied to the gate of FET N1. The FET N1 is preferably as small as possible to reduce capacitive feedthrough when the FET N1 is switched off. The SMPLEN signal is an active high signal.

The source of FET N1 is coupled to voltage reference circuit 515, which is shown as including a capacitor C1 connected between the source of FET N1 and system ground VSS. When the switch 510 is closed, the reference voltage $V_{ref}$ provided by the input circuit 505 is coupled to the voltage reference circuit 515. For this embodiment, the capacitor C1 is charged to the reference voltage $V_{ref}$ when the switch 510 is closed. The switch 510 is preferably closed for a sufficient time to ensure charging the capacitor C1 to $V_{ref}$. When the switch 510 opens, decoupling the input circuit 505 from the voltage reference circuit 510, the capacitor C1 holds the reference voltage $V_{ref}$. The capacitor C1 must be chosen such that it holds the reference voltage $V_{ref}$ for the duration of a programming cycle. For this embodiment, one millisecond is a sufficient amount of time. Further, the capacitor is preferably very large compared to the equivalent capacitance for the regulator circuit 503 to reduce the effects of noise coupled to the capacitor C1 via the regulator circuit 503.

Capacitors discharge over time due to charge leakage and are not typically used as voltage references due to their transitory nature. For programming nonvolatile memory cells, however, the length of time that the voltage of a capacitor can remain stable is sufficient to provide a reference voltage $V_{ref}$ for an entire programming cycle. The capacitor must be recharged between programming cycles, which means that the reference voltage $V_{ref}$ varies from programming cycle to programming cycle by the setpoint accuracy of the external supply, but the reference voltage $V_{ref}$ is held stable from programming pulse to programming pulse for each programming cycle. This added stability helps to ensure a more constant gate voltage and gate step voltage when programming memory cells, which reduces the possibility of programming overshoot.

The programming voltage regulation circuit 45 may be used as a voltage regulation circuit for any application wherein constant regulation is not required. If, as in this embodiment, the voltage reference supplied by the sample and hold circuit need only be provided for a limited amount of time, the voltage regulation circuit may be implemented.

The regulator circuit 503 is shown as including an operational amplifier 520 and a programmable resistive divider circuit 525. The operational amplifier 520 is coupled as a noninverting amplifier of a predefined gain having its positive input coupled to the voltage reference circuit 515 and its negative input coupled to its output via the programmable resistive divider circuit 525. The programming voltage supply VPP is the power supply for the operational amplifier 520.

The programmable resistive divider circuit 530 includes resistors R3-Rk connected in series between the output of the operational amplifier 525 and system ground VSS such that a plurality of nodes are defined, one each between the output of the operational amplifier 525 and resistor R3 and between each resistor. A plurality of n-channel FETs N2-Nk have their drains coupled to a corresponding one of the nodes and their sources coupled to a common output node for providing the output voltage $V_{out}$. The FETs N2-Nk act as switches in response to control voltages supplied at the gates of the FETs. The control voltages are supplied by a control engine which controls the output voltage $V_{out}$ during programming according to the exact placement algorithm described above. Preferably, only one of the FETs N2-Nk may be switched on at any one time. The resistors R3-Rk are preferably of equal value to provide a range of output voltages $V_{out}$ that are incremented in equal steps. The maximum voltage $V_{max}$, the minimum voltage $V_{min}$, and the step size are preferably chosen to provide the values required by the particular programming algorithm employed. For this embodiment, the range of voltages for $V_{out}$ is from 2.7 volts to 10.8 volts in 20 millivolt steps. Thus, the voltage directly at the output of the operational amplifier is equal to 10.8 volts, and the voltage at resistor Rk is equal to 2.7 volts. The negative input of the operational amplifier 520 is therefore actually coupled to the programmable resistive divider circuit 525 at a different tap point than shown. A "tap point" is a node between resistors in the resistive divider circuit 525.

Figure 6:
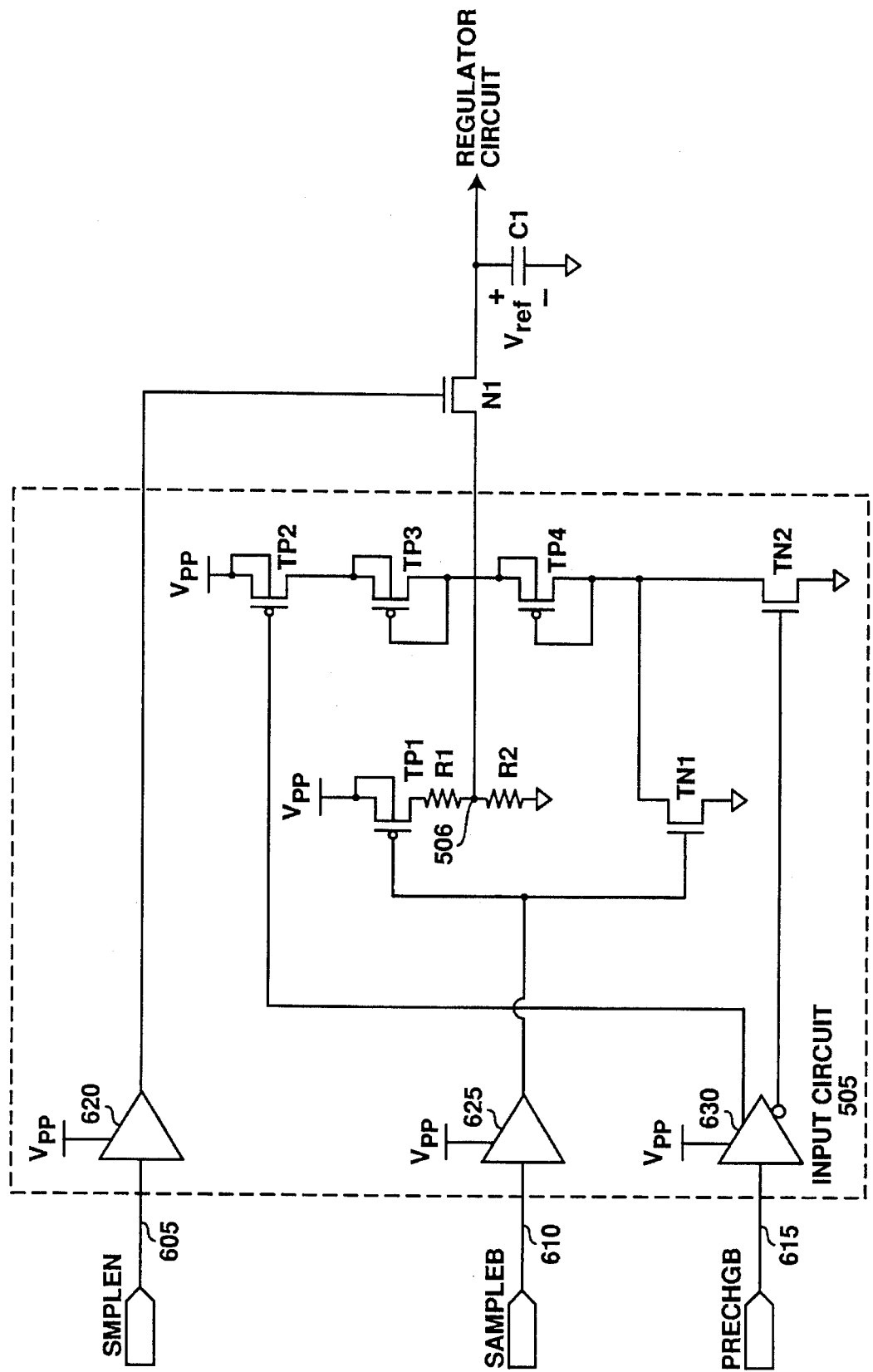
FIG. 6 shows an alternative embodiment for the input circuit of the programming voltage regulation circuit.

FIG. 6 shows an alternative embodiment for the input circuit 505. The embodiment of the input circuit 505 charges the capacitor C1 more quickly. Three control signals, SMPLEN, SAMPLEB, and PRECHGB are shown as controlling-the operation of the input circuit 505 via signal lines 605, 610, and 615 respectively. The control signals are provided by the control engine (not shown), the operation of which is described in more detail below. The SMPLEN signal controls a level shifter 620 for switching the FET N1 of the switching circuit 510 on and off. When the HOLD signal is a logic high (active), the level shifter 620 outputs a high voltage signal to the gate of FET N1, switching the FET on such that the capacitor C1 is coupled to the input circuit 505 at node 506.

The SAMPLEB signal controls a level shifter 625 for switching p-channel FET TP1 and n-channel FET TN1 on and off. The level shifter 625 has a single output such that only one of the FETs is on at any given time. When SAMPLEB is logic high (inactive) FET TP1 is switched off and FET TN1 is switched on. When SAMPLEB is logic low (active) FET TP1 is switched on and FET TN1 is switched off.

The PRECHGB signal controls a level shifter 630 for switching p-channel FET TP2 and n-channel FET TN1 on and off. Level shifter 630 has complementary outputs, wherein the noninverted output is coupled to the gate of FET TP2 and the inverted output is coupled to the gate of TN2. Thus, FETs TP2 and TN2 are either both on or both off. When PRECHGB is logic high (inactive) both FETs TP2 and TN2 are off. When PRECHGB is logic low (active) both FETs TP2 and TN2 are on. Each of the level shifters 620, 625 and 630 are supplied by the VPP supply. The noninverting outputs output a voltage approximately equal to VPP when the input control signal is a logic high, and the inverting outputs output the same voltage when the input control signal is a logic low.

The resistors R1 and R2 provide the reference voltage $V_{ref}$ at the node 506 when the SAMPLEB signal is active low. As described previously, resistor R1 is preferably equal to resistor R2 such that $V_{ref}$ is equal to one-half VPP. The resistor R2 is connected between node 506 and system ground VSS such that the drain of the switch FET N1 is pulled down to system ground when the SAMPLEB and PRECHGB signals are inactive high. This effectively isolates the capacitor C1 from any noise from the VPP supply that would otherwise be coupled to the capacitor via the input circuit 505 and the switch 510.

P-channel FETs TP3 and TP4 are provided as a precharge circuit for quickly precharging the capacitor C1 when the switch 510 is closed. The precharge circuit is enabled and disabled in response to the PRECHGB signal, which creates a path between the power supply VPP and system ground VSS by switching the FETs TP2 and TN2 on and removes the path by switching the FETs TP2 and TN2 off. FETs TP3 and TP4 both have their substrates connected to their sources and their drains coupled to their gates. The current produced by the precharge circuit is greater than that provided by the resistors R1 and R2, and the capacitor is precharged quickly, reducing the total amount of time necessary to charge the capacitor C1.

Figure 7:
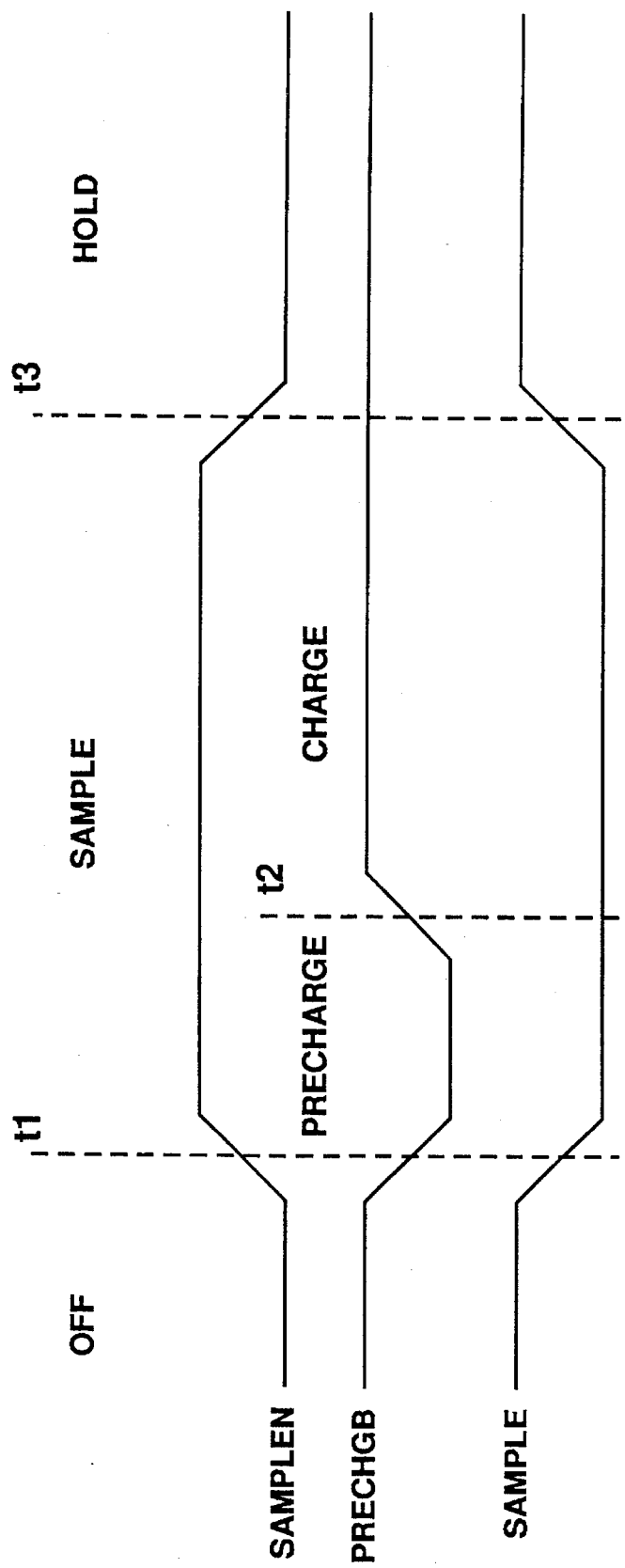
FIG. 7 is a timing diagram showing the operation of a programming voltage regulation circuit.

FIG. 7 is a timing diagram showing the operation of the input circuit 505 in response to the control signals. Initially, the switch 510 is off and the sample and hold circuit is in an off state. At time t1, the switch 510 is closed when the SAMPLEN signal goes active high. Simultaneously, both the PRECHGB and the SAMPLEB signals are asserted active low to increase the rate of charging for the capacitor C1. This period of precharging is designated as the precharge state for the sample and hold circuit 501. At time t2, the PRECHGB signal goes inactive high, ending the precharge state and beginning the charge state for the sample and hold circuit 501. The capacitor is fully charged to the reference voltage $V_{ref}$ during the charge state. The precharge and charge states together define the sample state for the sample and hold circuit 501 in which the input voltage $V_{in}$ is sampled. At time t3, all three control signals go inactive, and the switch 510 is opened, causing the sample and hold circuit 501 to enter a hold state in which the capacitor holds the reference voltage $V_{ref}$.

Figure 8:
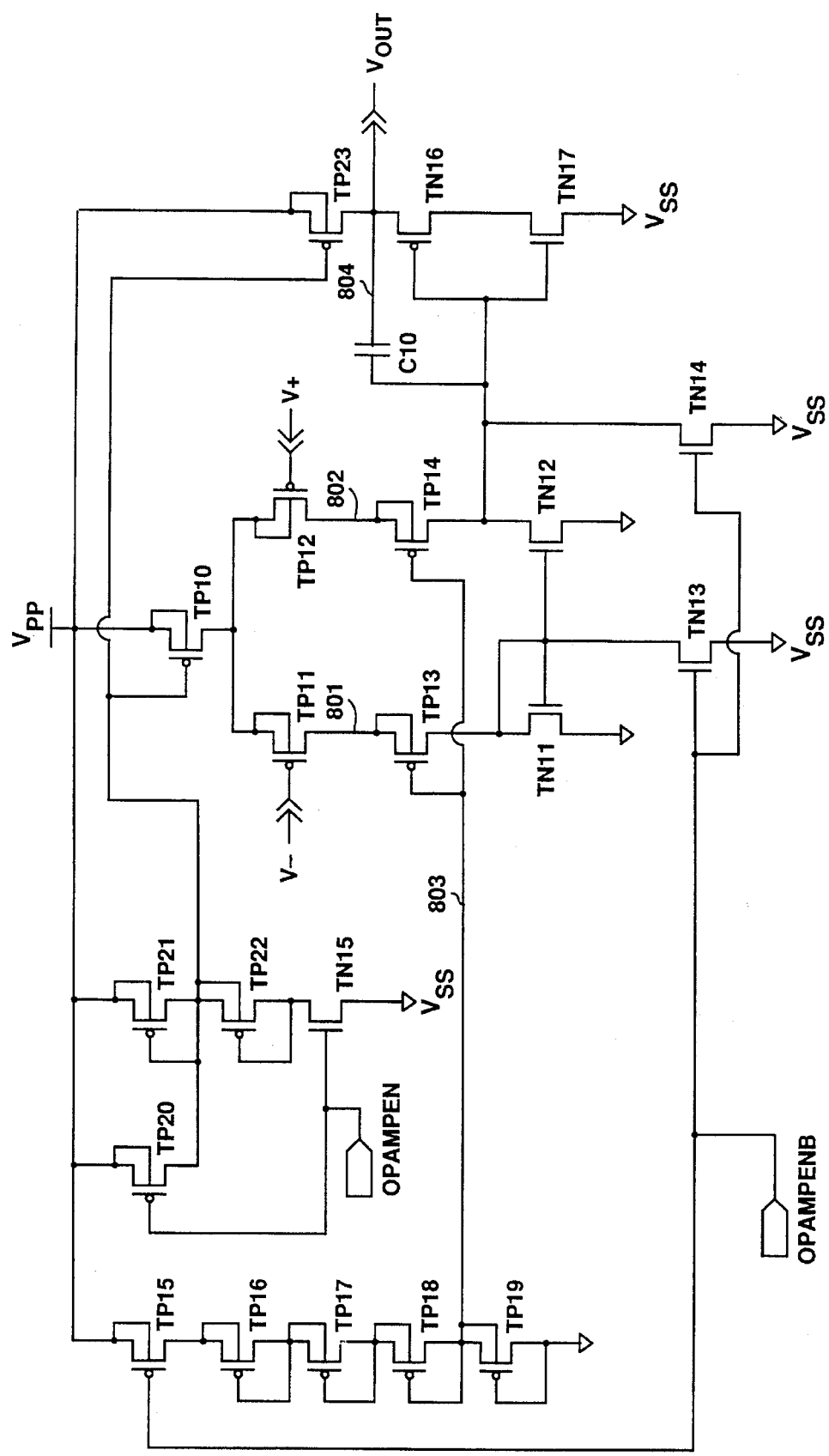
FIG. 8 shows an operational amplifier according to one embodiment.

FIG. 8 shows an operational amplifier according to one embodiment. Operational amplifier 520 includes a differential input pair of p-channel FETs TP11 and TP12. The gate of TP12 is connected to the voltage V+ at the positive terminal, and the gate of TP11 is connected to the voltage V− at the negative terminal. As shown in FIG. 5, the positive terminal of operational amplifier 520 is coupled to the capacitor C1, and the voltage V+ is the reference voltage $V_{ref}$. The voltage V− is the voltage from the programmable resistive divider circuit 530. P-channel FET TP10 and acts as a current source for the differential pair when the operational amplifier 520 is enabled. A complementary pair of enable signals, OPAMPEN and OPAMPENB are provided by the control engine 60 or other control circuitry for enabling and disabling the operational amplifier 520. When the operational amplifier 520 is disabled, the output node 804 is tri-stated such that the programmable resistive divider circuit 530 may be used with other voltage inputs.

P-channel FETs TP13 and TP14 are cascode devices that limit the voltage at nodes 801 and 802, respectively. Limiting the voltage at node 802 limits the drain-to-source voltage of FET TP12 such that the generation of hot electrons across the gate of FET TP12 is avoided. Hot electrons effectively increase the rate at which the capacitor C1 discharges, and such effects should be avoided to better ensure that the capacitor C1 provides the reference voltage $V_{ref}$ for the desired period of time.

P-channel FETs TP16–TP19 act as a voltage divider circuit for providing a biasing voltage to the gates of cascode FETs TP13 and TP14. The voltage at node 803 is approximately equal to one-fourth of VPP. FETs TP16–TP19 may be equivalently replaced with resistors. FET TP15 decouples VPP from the FETs TP16–TP19 when the operational amplifier 520 is disabled.

The output stage of the operational amplifier 520 includes capacitor C10, and n-channel FETs TN16, TN17, and TP23. FET TN16 is a low threshold voltage, thick oxide device that isolates the FET TN17 from the high voltages at the output node 804. FET TP23 acts as a current source for the output stage when the operational amplifier 520 is enabled.

Enablement circuitry for the operational amplifier 520 includes n-channel FETs TN13-TN15 and p-channel FETs TP20-TP22. The operational amplifier 520 is enabled when the OPAMPEN signal is logic high and the OPAMPENB signal is logic low. The operational amplifier 520 is disabled when the OPAMPEN signal is logic low and the OPAMPENB signal is logic high. Disabling the operational amplifier causes the FETs TP10, TN11 and TN12 to be switched off such that current is not provided to the differential pair TP11 and TP12. Further, FETs TN13 and TN14 are switched on, which switches off FETs TN16 and TN17, isolating the output node 804 from system ground VSS. Finally, FET TP20 is switched on, which causes the gate of FET TP23 to be pulled up towards VPP. FET TP23 is thus switched off, isolating the output node 804 from VPP. Thus, output node 804 floats when the operational amplifier 520 is disabled.

In the foregoing specification, the invention has been described with reference to specific exemplary embodiments thereof. The specification and drawings are, accordingly, to be regarded in an illustrative rather than a restrictive sense. It will, however, be evident that various modifications and changes may be made thereto without departing from the broader spirit and scope of the invention as set forth in the appended claims.

What is claimed is:

1. A voltage regulation circuit, comprising:
   a sample and hold circuit for sampling an input voltage and for holding a reference voltage generated in response to the input voltage, the sample and hold circuit including a capacitor that holds the reference voltage; and
   a regulator circuit coupled to the capacitor of the sample and hold circuit, the regulator circuit for outputting an output voltage using the reference voltage supplied by the capacitor.

2. The voltage regulation circuit of claim 1, wherein the sample and hold circuit further comprises:
   an input circuit coupled to the input voltage, the input circuit for generating the reference voltage in response to the input voltage;
   a switch coupled to the input circuit and the capacitor, the switch for coupling the input circuit to the capacitor in response to a first control signal when the first control signal is in a first state such that the capacitor is charged to the reference voltage and for decoupling the input circuit from the capacitor when the first control signal is in a second state.

3. The voltage regulation circuit of claim 2, wherein the input circuit comprises:
   a first resistor coupled to the input voltage;
   a second resistor coupled in series with the first resistor to system ground, wherein the reference voltage is supplied at a node between the first and second resistors.

4. The voltage regulation circuit of claim 3, wherein the input circuit further comprises:
   a precharge circuit coupled to the node and to a supply voltage, the precharge circuit for quickly charging the capacitor.

5. The voltage regulation circuit of claim 4, wherein the first resistor is coupled to the supply voltage in response to a second control signal.

6. The voltage regulation circuit of claim 5, wherein the precharge circuit is coupled to the supply voltage in response to a third control signal.

7. The voltage regulation circuit of claim 3, wherein the input voltage is equivalent to the supply voltage.

8. The voltage regulation circuit of claim 1, wherein the regulator circuit comprises:
   an operational amplifier having an output, a first input and a second input, wherein the positive input is coupled to receive the reference voltage;
   a programmable resistive divider circuit coupled to the output of the operational amplifier, the programmable resistive divider circuit for providing the output voltage in response to the output of the operational amplifier and a control signal, wherein the second input of the operational amplifier is coupled to the programmable resistive divider circuit.

9. The voltage regulation circuit of claim 8, wherein the operational amplifier includes a p-channel field effect transistor having a gate, the gate being the first input.

10. The voltage regulation circuit of claim 8, wherein a first capacitance of the capacitor is greater than a capacitance for the operational amplifier.

11. The voltage regulation circuit of claim 8, wherein the programmable resistive divider circuit comprises:
   a plurality of resistors coupled in series between the output of the operational amplifier and system ground; and
   a selector circuit coupled to the plurality of resistors, the selector circuit for selecting a tap point in the plurality of resistors.

12. In a nonvolatile memory device, a programming voltage regulation circuit for supplying a gate voltage to program a nonvolatile memory cell, comprising:

a sample and hold circuit coupled to an external input voltage, the sample and hold circuit for sampling the external input voltage and for holding a reference voltage generated in response to the input voltage, the sample and hold circuit including a capacitor that holds the reference voltage; and a regulator circuit coupled to the capacitor of the sample and hold circuit, the regulator circuit for outputting a programming voltage using the reference voltage supplied by the capacitor.

13. The programming voltage regulation circuit of claim 12, wherein the external input voltage is supplied by a regulated power supply.

14. The programming voltage regulation circuit of claim 13, wherein the external input voltage is supplied by a static voltage reference.

15. The programming voltage regulation circuit of claim 12, wherein the sample and hold circuit further comprises:

an input circuit coupled to the input voltage, the input circuit for generating the reference voltage in response to the input voltage;

a switch coupled to the input circuit and the capacitor, the switch for coupling the input circuit to the capacitor in response to a first control signal when the first control signal is in a first state such that the capacitor is charged to the reference voltage and for decoupling the input circuit from the capacitor when the first control signal is in a second state.

16. The programming voltage regulation circuit of claim 15, wherein the input circuit comprises:

a first resistor coupled to the external input voltage;

a second resistor coupled in series with the first resistor to system ground, wherein the reference voltage is supplied at a node between the first and second resistors.

17. The programming voltage regulation circuit of claim 16, wherein the input circuit further comprises:

a precharge circuit coupled to the node and to a supply voltage, the precharge circuit for quickly charging the capacitor.

18. The programming voltage regulation circuit of claim 17, wherein the first resistor is coupled to the supply voltage in response to a second control signal.

19. The programming voltage regulation circuit of claim 18, wherein the precharge circuit is coupled to the supply voltage in response to a third control signal.

20. The programming voltage regulation circuit of claim 17, wherein the input voltage is equivalent to the supply voltage.

21. The programming voltage regulation circuit of claim 12, wherein the regulator circuit comprises:

an operational amplifier having an output, a first input and a second input, wherein the positive input is coupled to receive the reference voltage;

a programmable resistive divider circuit coupled to the output of the operational amplifier, the programmable resistive divider circuit for providing the output voltage in response to the output of the operational amplifier and a control signal, wherein the second input of the operational amplifier is coupled to the programmable resistive divider circuit.

22. The programming voltage regulation circuit of claim 21, wherein the operational amplifier includes a p-channel field effect transistor having a gate, the gate being the first input.

23. The programming voltage regulation circuit of claim 21, wherein a first capacitance of the capacitor is greater than a capacitance for the operational amplifier.

24. The programming voltage regulation circuit of claim 21 wherein the programmable resistive divider circuit comprises:

a plurality of resistors coupled in series between the output of the operational amplifier and system ground; and a selector circuit coupled to the plurality of resistors, the selector circuit for selecting a tap point in the plurality of resistors.

25. The programming voltage regulation circuit of claim 12, wherein the programming voltage regulation circuit supplies a drain voltage to a drain of the nonvolatile memory cell.

26. The programming voltage regulation circuit of claim 12, wherein the programming voltage regulation circuit supplies a source voltage to a source of the nonvolatile memory cell to program the nonvolatile memory cell.

27. The programming voltage regulation circuit of claim 12, wherein the nonvolatile memory cell can achieve at least three analog states.

28. A method for generating an output voltage in response to an input voltage, the method comprising the steps of:

a voltage generator generating a reference voltage in response to the input voltage;

charging a capacitor to the reference voltage;

decoupling the voltage generator from the capacitor;

holding the reference voltage by the capacitor; generating the output voltage using the reference voltage supplied by the capacitor.

* * * * *

UNITED STATES PATENT AND TRADEMARK OFFICE
CERTIFICATE OF CORRECTION

PATENT NO.   : 5,497,119
DATED        : March 5, 1996
INVENTOR(S)  : Tedrow et al.

It is certified that error appears in the above-identified patent and that said Letters Patent is hereby corrected as shown below:

In the Title Page at [75] delete "Kenneth Woiciechowski" and insert -- Kenneth Wojciechowski--

In column 5 at lines 6-7 delete "row decoder 152, column decoder 154, sensing circuitry 156, reference cell array 158," and insert --row decoder 52, column decoder 54, sensing circuitry 56, reference cell array 58,--

In column 5 at line 10 delete "memory array 150," and insert --memory array 50,--

In column 6 at line 25 delete "$V_{vin}$," and insert --$V_{in}$--

Signed and Sealed this

Fifth Day of November, 1996

BRUCE LEHMAN

*Attest:*

*Attesting Officer*   *Commissioner of Patents and Trademarks*